United States Patent
Kim

(10) Patent No.: US 8,274,852 B2
(45) Date of Patent: Sep. 25, 2012

(54) SEMICONDUCTOR MEMORY APPARATUS AND METHOD OF TESTING THE SAME

(75) Inventor: Young Soo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 488 days.

(21) Appl. No.: 12/494,511

(22) Filed: Jun. 30, 2009

(65) Prior Publication Data

US 2010/0195377 A1 Aug. 5, 2010

(30) Foreign Application Priority Data

Feb. 5, 2009 (KR) .................. 10-2009-0009357

(51) Int. Cl.
*G11C 7/00* (2006.01)
*G11C 29/00* (2006.01)

(52) U.S. Cl. .............. 365/201; 365/163; 365/210.1; 365/210.13

(58) Field of Classification Search .............. 365/163, 365/201, 210.1, 210.13
See application file for complete search history.

(56) References Cited

U.S. PATENT DOCUMENTS

| | | | | |
|---|---|---|---|---|
| 5,852,581 A * | 12/1998 | Beffa et al. | ................... | 365/201 |
| 6,205,067 B1 * | 3/2001 | Tsukude | ....................... | 365/201 |
| 6,351,419 B1 * | 2/2002 | Dietrich et al. | .......... | 365/189.04 |
| 6,535,440 B2 * | 3/2003 | Lim et al. | ....................... | 365/201 |
| 6,707,737 B2 * | 3/2004 | Tanizaki | ....................... | 365/201 |
| 6,778,449 B2 * | 8/2004 | Breitwisch et al. | ........... | 365/201 |
| 7,095,652 B2 * | 8/2006 | Higashi et al. | ........... | 365/185.13 |
| 7,573,766 B2 * | 8/2009 | Choi et al. | ....................... | 365/201 |
| 8,130,541 B2 * | 3/2012 | Kim et al. | ....................... | 365/163 |
| 2010/0238699 A1 * | 9/2010 | Miyakawa et al. | ........... | 365/145 |
| 2011/0182113 A1 * | 7/2011 | Yoon | ............................. | 365/163 |

FOREIGN PATENT DOCUMENTS

| | | |
|---|---|---|
| KR | 10-0688540 B1 | 2/2007 |
| KR | 1020070018583 A | 2/2007 |
| KR | 1020070024803 A | 3/2007 |
| KR | 10-0843142 B1 | 6/2008 |

\* cited by examiner

*Primary Examiner* — Tuan T Nguyen
*Assistant Examiner* — Lance Reidlinger
(74) *Attorney, Agent, or Firm* — Ladas & Parry LLP

(57) ABSTRACT

A semiconductor memory apparatus includes a sense amplifier coupled to a plurality of bit lines, a switching unit configured to cause the plurality of bit lines to be coupled to a first node in response to a switching signal, a mode selecting unit configured to selectively couple the first node to a pad or a ground terminal in response to a mode selection signal and a testing unit configured to supply current to the pad during a test mode.

14 Claims, 2 Drawing Sheets

SEMICONDUCTOR MEMORY APPARATUS AND METHOD OF TESTING THE SAME

CROSS-REFERENCES TO RELATED PATENT APPLICATION

The present application claims priority under 35 U.S.C 119(a) to Korean Application No. 10-2009-0009357, filed on Feb. 5, 2009, in the Korean Intellectual Property Office, the disclosure of which is incorporated herein by reference in its entirety as set forth in full.

BACKGROUND

1. Technical Field

The present invention relates generally to a semiconductor memory apparatus, and more particularly, to a performance test on a sense amplifier in a semiconductor memory apparatus.

2. Related Art

A typical semiconductor memory apparatus includes a plurality of bit lines intersecting word lines to form memory cells. Phase-change random access memory (PRAM) is a type of semiconductor memory apparatus currently considered as having promise due to its ability to maintain information during the interruption of power, and since it possesses many of the desirable characteristics of dynamic random access memory (DRAM) apparatuses. A typical PRAM apparatus includes a plurality of memory cells each having one cell transistor connected to a word line and one variable resistor connected to a bit line. The variable resistor of the memory cell is manufactured using a special thin film material, such as a chalcogenide (Ge2Sb2Te5) alloy, functioning as a reversible phase change material. The variable resistor has electric characteristics in which resistivity becomes relatively high in an amorphous state and resistivity becomes relatively low in a crystal state. Therefore, the different states of the phase change material can be used to represent logic values of data, and data stored in a memory cell can be differentiated using the difference between the resistivities of the variable resistor. In other words, information can be written by setting the state in which the resistivity of the variable resistor becomes high at a digital logic value '1' and a state in which the resistivity of the variable resistor becomes low at a digital logic value '0'. The reversible phase change of the variable resistor is made to occur by Joule heat which is generated by applying electric pulses from the outside. As such, a process of controlling the phase change of the variable resistor is referred to as Set/Reset. Therefore, a PRAM type semiconductor memory apparatus can serve as a non-volatile memory apparatus.

In a typical semiconductor memory apparatus, a sense amplifier is not required for each memory cell; and instead, one sense amplifier is typically required for a plurality of memory cells. Each memory cell is connected to the sense amplifier through the bit line, and the sense amplifier functions to amplify current of the bit line during the data output operation. A configuration for the discharge of current remaining in the bit line is further provided in the memory cell region. The bit line discharge operation should be performed immediately before the data input operation is performed.

An important issue of semiconductor memory apparatuses is the defect rate. It is confirmed that the defects often occur in the memory cells within the core region. Herein, it is estimated that the characteristics of the sense amplifier is a cause of defects occurring in the memory cells. However, a method of testing the characteristics of the sense amplifier is not known to exist. In other words, a designer does not have a method in which it can be determined whether the sense amplifier can amplify current to a certain degree. Therefore, it is not easy to understand the cause of the defects occurring in the memory cells. As a consequence, it is impossible to test the characteristics of the sense amplifier using conventional configurations of the semiconductor memory apparatus. The difficulties in determining the cause of defects makes it difficult to design solutions for improving the defect rate.

SUMMARY

Embodiments of the present invention include a semiconductor memory apparatus capable of testing characteristics of a sense amplifier and a method of testing the same.

In one embodiment, a semiconductor memory apparatus includes a sense amplifier coupled to a plurality of bit lines; a switching unit configured to cause the plurality of bit lines to be coupled to a first node in response to a switching signal; a mode selecting unit configured to selectively couple the first node to a pad or a ground terminal in response to a mode selection signal, wherein the pad receives a current and the first node is coupled to the pad during a test mode; and a testing unit configured to supply the current to the pad.

In another aspect, a method of testing a semiconductor memory apparatus includes combining address codes to generate a mode selection signal; causing a plurality of bit lines to be coupled to a pad by enabling a switching signal at a read timing when the mode selection signal instructs a test mode; and supplying current output from a testing unit to the plurality of bit lines through the pad.

In still another aspect, a semiconductor memory apparatus includes a memory block including a plurality of memory cells coupled to a plurality of bit lines; a sense amplifier coupled to the plurality of bit lines; a modeling cell array including a plurality of memory cells coupled to the sense amplifier, each memory cell of the modeling cell array being coupled to a bit line of the plurality of bit lines and selectively coupled to a first node; and a switching unit coupled to each of the memory cells of the modeling cell array and responsive to a switching signal to cause the plurality of bits lines to be coupled to the first node, wherein the first node receives a current for testing the sense amplifier when a test mode is enabled.

These and other features, aspects, and embodiments are described below in the "Detailed Description."

BRIEF DESCRIPTION OF THE DRAWINGS

Features, aspects, and embodiments are described in conjunction with the attached drawings, in which.

DETAILED DESCRIPTION

Hereinafter, the preferred embodiments will be described in detail with reference to the accompanying drawings.

Figure 1:
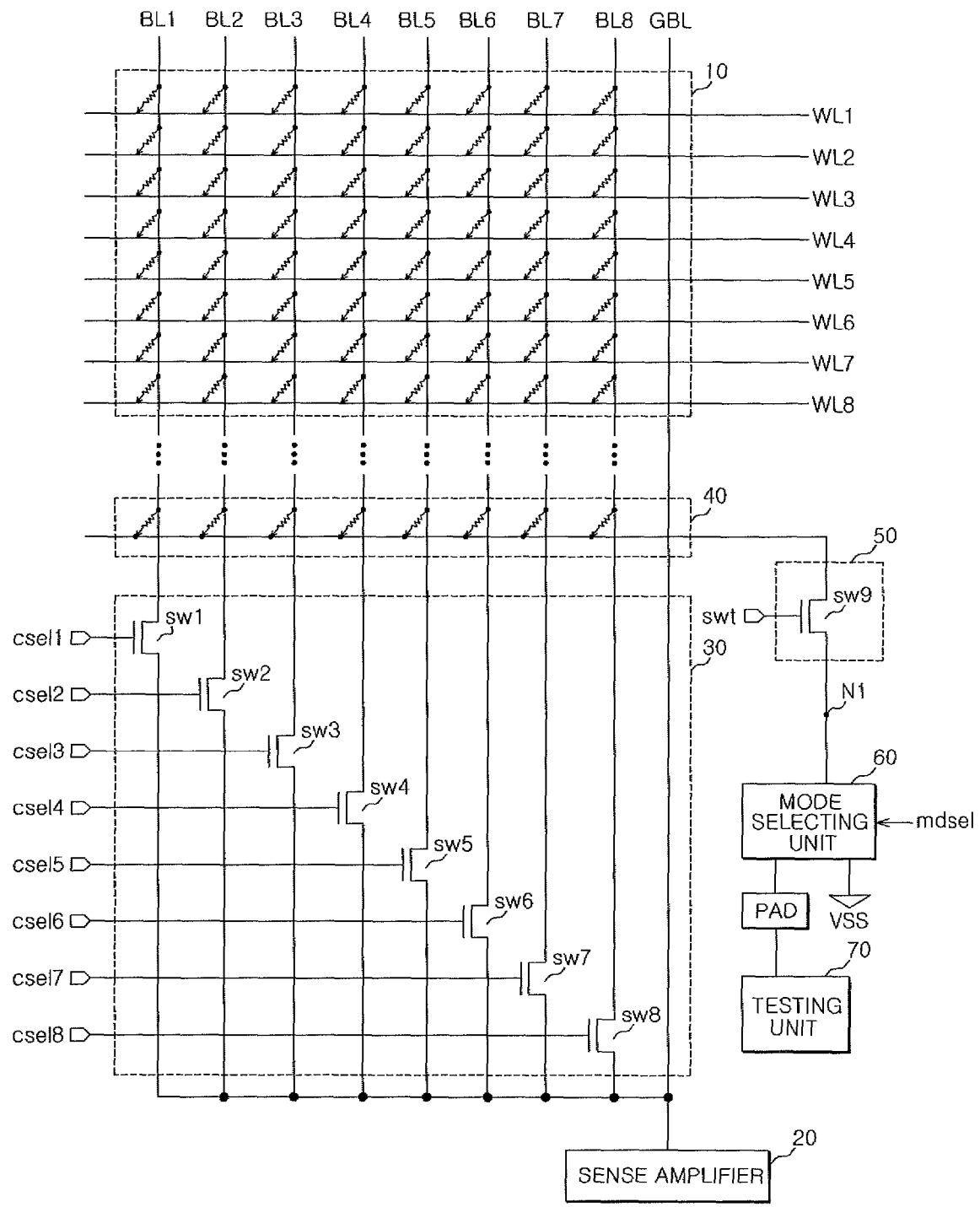
FIG. 1 is a diagram showing a configuration of a semiconductor memory apparatus according to an embodiment of the present invention.

FIG. 1 shows a configuration diagram of a semiconductor memory apparatus according to an embodiment of the present invention. For convenience of explanation, FIG. 1 schematically shows a part of a memory cell region.

As shown, the semiconductor memory apparatus according to an embodiment includes a memory block 10, a sense amplifier 20, a column selecting unit 30, a modeling cell array 40, a switching unit 50, a mode selecting unit 60, and a testing unit 70.

In an embodiment, the memory block 10 includes, for example, a plurality of memory cells located at intersections of first to eighth word lines WL1 to WL8 and first to eighth bit lines BL1 to BL8. The sense amplifier 20 is coupled to a global bit line GBL. In an embodiment, the column selecting unit 30 is configured to selectively couple the respective first to eighth bit lines BL1 to BL8 to the global bit line GBL according to first to eighth column selection signals 'csel1 to csel8'. In an embodiment, the modeling cell array 40 is provided between the memory block 10 and the column selecting unit 30 and includes a plurality of memory cells each coupled to a corresponding one of the first to eighth bit lines BL1 to BL8. In an embodiment, the switching unit 50 is configured to selectively couple a first node N1 to each memory cell of the modeling cell array 40 according to a switching signal 'swt'. In an embodiment, the mode selecting unit 60 is configured to selectively couple the first node N1 to one of a pad PAD and a ground terminal according to a mode selection signal 'mdsel'. In an embodiment, the testing unit 70 is configured to supply current to the pad when the apparatus is in a test mode.

As described above, the memory cells are located at intersections of the bit lines BL and word lines WL. In an embodiment, each memory cell included in the memory block 10 has a general configuration in which the memory cell is coupled to the corresponding bit line BL when the corresponding word line WL is activated.

The present invention is not limited to the configuration shown in FIG. 1. For example, in addition to the memory block 10 shown in the drawings, further memory blocks may be provided and the sense amplifier 20 may be commonly connected to the plurality of memory blocks. Here, the number of the column selecting unit 30, the modeling cell array 40, the switching unit 50, and the mode selecting unit 60 are equal to the number of memory blocks 10. The global bit line GBL performs the function of coupling the plurality of memory blocks to the sense amplifier 20.

The first to eighth column selection signals 'csel1 to csel8' are generated by decoding a column address. In the embodiment shown in FIG. 1, the column selecting unit 30 includes eight switching elements SW1 to SW8, and the switching elements SW1 to SW8 are turned-on in response to the level of the first to eighth column selection signal 'csel1 to csel8', respectively. Only one of the first to eighth column selection signals 'csel1 to csel8' is enabled, and the corresponding bit line BL and the global bit line GBL can be coupled to each other in response to the enabled column selection signal 'csel'.

The switching signal 'swt' input to the switching unit 50 is implemented by a bit line discharge signal during normal operation. Conversely, the switching signal 'swt' is implemented by a combination of a plurality of address codes during the test operation. At this time, the plurality of address codes should have memory block position information. It is preferable that the switching signal 'swt' is enabled at a read operation timing during the test operation and has a long enable period as compared to the bit line discharge signal.

The switching unit 50 includes a ninth switching element SW9. One terminal of the ninth switching element SW9 is coupled to each memory cell of the modeling cell array 40 and the other terminal is coupled to the first node N1. The ninth switching element SW9 is turned-on when the switching signal 'swt' is enabled, so that each of the memory cells of the modeling cell array 40 is coupled to the mode selection unit 60 when the switching signal 'swt' is enabled.

In an embodiment, the memory cell array 40 is included and configured so that each of the memory cells of the modeling cell array 40 is set in a crystalline state, such that each of the memory cells has low resistivity. Therefore, it can be understood that the switching unit 50 and the first to eighth bit lines BL1 to BL8 are connected to each other with low resistivity. Thus, when the modeling cell array 40 is included, the sense amplifier 20 can amplify current of the first to eighth bit lines BL1 to BL8 during the test in a manner nearly identical as to what would occur during actual operation, such that an even more precise test result can be extracted. In other words, the modeling cell array 40, which may be configured to include an element such as a MOS transistor in some cases, can be implemented in a manner such that the signal line connected to the switching unit 50 is directly connected to the first to eighth bit lines BL1 to BL8.

The mode selection signal 'mdsel' is generated by a combination of a plurality of address codes similar to how the switching signal 'swt' is generated. In other words, when the addresses input from the outside are combined in a specific manner so as to designate a test mode, the mode selection signal 'mdsel' selects the test mode.

The mode selection unit 60 implements the test mode by connecting the first node N1 to the pad PAD when the test mode is selected by the mode selection signal 'mdsel' and implements the normal operation mode by connecting the first node N1 to the ground terminal when the normal operation mode is selected by the mode selection signal 'mdsel'.

In other words, the mode selection unit 60 connects the first node N1 to the ground terminal during the normal operation mode. At this time, the switching signal 'swt' is implemented by the bit line discharge signal. Therefore, during the discharge operation period the switching unit 50 will connect the first node N1 to the first to eighth bit lines BL1 to BL8 so that all of the first to eighth bit lines BL1 to BL8 are discharged at a ground voltage VSS level.

During the test mode, the mode selection unit 60 connects the first node N1 to the pad PAD. At this time, the switching signal 'swt' is enabled and the switching unit 50 connects the first node N1 to the first to eighth bit lines BL1 to BL8. As a result, all of the first to eighth bit lines BL1 to BL8 are coupled to the pad PAD.

The testing unit 70 includes a current source to perform the function of supplying current to the pad PAD during the test mode. In an embodiment, the current supplied to the pad PAD from the testing unit 70 can be changed by an experimenter. The current supplied to the pad PAD from the testing unit 70 is supplied to the first to eighth bit lines BL1 to BL8 during the test mode. As such, a test on whether the sense amplifier 20 can sense current to some degree and amplify it can be performed.

As described above, the semiconductor memory apparatus according to an embodiment of the present invention can cause the first to eighth bit lines BL1 to BL8 to be coupled to the pad PAD during the test mode in the memory cell region. Therefore, testing can be performed to determine whether the sense amplifier 20 can sense current to some degree and amplify it. As such, it is possible to reduce the defect rate in the memory cell region by obtaining understanding the characteristics of the sense amplifier 20.

Figure 2:
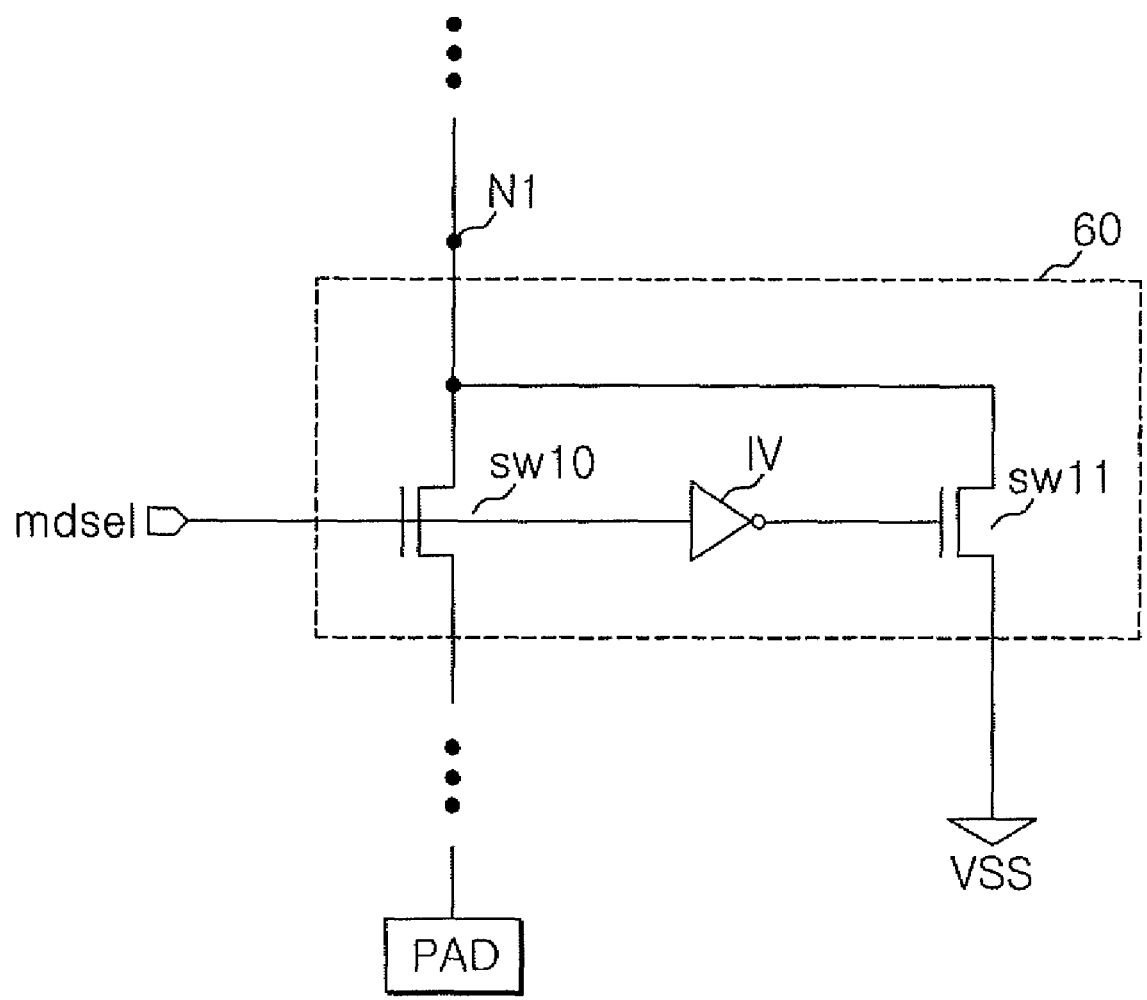
FIG. 2 is a diagram of a configuration of the mode selection unit shown in FIG. 1 according to an embodiment of the present invention.

FIG. 2 is a diagram of a configuration of the mode selection unit shown in FIG. 1 according to an embodiment of the present invention.

As shown in FIG. 2, the mode selection unit 60 is configured to include tenth and eleventh switching elements SW10 and SW11 and an inverter IV.

The tenth switching element SW10 connects the first node N1 to the pad PAD according to the mode selection signal 'mdsel'. The inverter IV receives and inverts the mode selection signal 'mdsel'. The eleventh switching element SW11 connects the first node N1 to the ground terminal according to an output signal of the inverter IV.

It can be appreciated from FIG. 2 that the tenth switching element SW10 sets a current path from the first node N1 to the pad PAD, and the eleventh switching element SW11 sets a current path from the first node N1 to the ground terminal. With such a configuration, when a voltage level of the mode selection signal 'mdsel' is a high level, the tenth switching element SW10 is turned-on, such that the first node N1 is applied with the voltage of the pad PAD. Likewise, when a voltage level of the mode selection signal 'mdsel' is a low level, the eleventh switching element SW11 is turned-on, such that the first node N1 is applied with the voltage of the ground terminal.

As described above, the semiconductor memory apparatus according to embodiments of the present invention performs an operation to cause the plurality of bit lines to be coupled to the ground terminal when in the bit line discharge period during the normal operation mode within the memory cell region, and performs an operation to cause the plurality of bit lines to be coupled to the pad during the test mode. Therefore, it is possible to test how the characteristics of the sense amplifier are changed according to a variable voltage applied to the plurality of bit lines. As a result, defects of the sense amplifier can be prevented and production efficiency of the semiconductor memory apparatus can be improved through an understanding of the characteristics of the sense amplifier.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A method of testing a semiconductor memory apparatus comprising:
    combining address codes to generate a mode selection signal; and
    causing a plurality of bit lines to be coupled to a pad by enabling a switching signal at a read timing when the mode selection signal instructs a test mode.

2. The method of testing a semiconductor memory apparatus according to claim 1, further comprising: causing the plurality of bit lines to be coupled to a ground terminal by enabling the switching signal at a bit line discharge operation timing when the mode selection signal instructs a normal operation mode.

3. The method of testing a semiconductor memory apparatus according to claim 1, wherein the semiconductor memory apparatus is a phase-change memory apparatus.

4. A semiconductor memory apparatus comprising:
    a memory block including a plurality of memory cells coupled to a plurality of bit lines;
    a sense amplifier coupled to the plurality of bit lines;
    a modeling cell array including a plurality of memory cells coupled to the sense amplifier, each memory cell of the modeling cell array being coupled to a bit line of the plurality of bit lines and selectively coupled to a first node; and
    a switching unit coupled to each of the memory cells of the modeling cell array and responsive to a switching signal to cause the plurality of bits fines to be coupled to the first node, wherein the first node receives a current for testing the sense amplifier when a test mode is enabled.

5. The semiconductor memory apparatus according to claim 4, further comprising:
    a mode selecting unit responsive to a mode selection signal to cause the node to be coupled to a pad being supplied the current when the test mode is enabled and to cause the first node to be coupled to a ground terminal when the test mode is disabled.

6. The semiconductor memory apparatus according to claim 5, wherein the switching signal is enabled during a discharge operation and during the test mode to cause the first node to be coupled to the plurality of bit lines, such that the plurality of bit lines are coupled to the pad during the test mode and the plurality of bit lines are coupled to the ground terminal during the discharge operation.

7. The semiconductor memory apparatus according to claim 4, wherein the cells of the modeling cell array are phase change memory cells each having a variable resistance, and each of the phase change memory cells is set to the same phase.

8. A semiconductor memory apparatus comprising:
    a sense amplifier coupled to a plurality of bit lines;
    a switching unit configured to cause the plurality of bit lines to be coupled to a first node in response to a switching signal;
    a mode selecting unit configured to selectively couple the first node to a pad or a ground terminal in response to a mode selection signal, wherein the pad receives a current and the first node is coupled to the pad during a test mode and the mode selection signal is implemented by a combination of an address having a plurality of bits;
    a memory block including a plurality of memory cells that are each coupled to a word line and a bit line of the plurality of bit lines; and
    a modeling cell array including a plurality of memory cells that are provided between the memory block and the sense amplifier, each memory cell of the modeling cell array being coupled to a bit line of the plurality of bit lines.

9. The semiconductor memory apparatus according to claim 8, wherein the switching signal is implemented by a bit line discharge signal during a normal operation mode and is implemented by a combination of an address having a plurality of bits including memory block position information during a test mode.

10. The semiconductor memory apparatus according to claim 9, wherein
    the mode selecting unit is configured to cause the first node to be coupled to the pad when the test mode is selected by the mode selection signal and to cause the first node be coupled to the ground terminal when the normal operation mode is selected by the mode selection signal.

11. The semiconductor memory apparatus according to claim 10, wherein during a discharge operation, the mode selecting unit selects the normal operation mode, and the switching signal is enabled such that the switching unit causes the bits lines to be coupled ground.

12. The semiconductor memory apparatus according to claim 1, wherein the sense amplifier is coupled to the plurality of bit lines through a global bit line.

13. The semiconductor memory apparatus according to claim 12, further comprising a column selecting unit configured to selectively couple the bit lines to the global bit line in response to a plurality of column selection signals.

14. The semiconductor memory apparatus according to claim 8, wherein the semiconductor memory apparatus is a phase-change memory apparatus.

* * * * *